(12) United States Patent
Hwang et al.

(10) Patent No.: US 7,638,857 B2
(45) Date of Patent: Dec. 29, 2009

(54) STRUCTURE OF SILICON CONTROLLED RECTIFIER

(75) Inventors: Hsin-Yen Hwang, Hsinchu Conty (TW); Shu-Hsuan Su, Hsinchu (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/116,396

(22) Filed: May 7, 2008

(65) Prior Publication Data

US 2009/0278168 A1     Nov. 12, 2009

(51) Int. Cl.
| | |
|---|---|
| H01L 29/861 | (2006.01) |
| H01L 31/107 | (2006.01) |
| H01L 29/864 | (2006.01) |
| H01L 29/30 | (2006.01) |
| H01L 29/866 | (2006.01) |
| H01L 29/88 | (2006.01) |
| H01L 29/73 | (2006.01) |
| H01L 29/74 | (2006.01) |
| H01L 31/111 | (2006.01) |
| H01L 29/739 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/00 | (2006.01) |

(52) U.S. Cl. .................. 257/603; 257/106; 257/175; 257/199; 257/481; 257/482; 257/551; 257/604; 257/605; 257/606; 257/E29.18; 257/E29.334; 257/E29.335; 257/E31.063

(58) Field of Classification Search .................. 257/106, 257/175, 199, 481–482, 551, 603–606, E29.18, 257/E29.334, E29.335, E31.063
See application file for complete search history.

(56) References Cited

U.S. PATENT DOCUMENTS

| | | | | | |
|---|---|---|---|---|---|
| 4,901,132 | A | * | 2/1990 | Kuwano | 257/134 |
| 5,045,902 | A | * | 9/1991 | Bancal | 257/328 |
| 5,235,201 | A | * | 8/1993 | Honna | 257/357 |
| 5,274,262 | A | | 12/1993 | Avery | |
| 5,311,042 | A | * | 5/1994 | Anceau | 257/173 |
| 5,341,005 | A | * | 8/1994 | Canclini | 257/173 |
| 5,389,813 | A | * | 2/1995 | Schwob | 257/469 |
| 5,414,292 | A | * | 5/1995 | Williams | 257/373 |
| 5,821,572 | A | * | 10/1998 | Walker et al. | 257/107 |
| 5,856,214 | A | | 1/1999 | Yu | |
| 5,889,310 | A | * | 3/1999 | Terashima et al. | 257/409 |
| 6,114,226 | A | | 9/2000 | Chang et al. | |

(Continued)

*Primary Examiner*—Ida M Soward
(74) *Attorney, Agent, or Firm*—J.C. Patents

(57) ABSTRACT

A silicon controlled rectifier structure is provided in a substrate having a first conductive type. A well region formed within the substrate has a second conductive type. A first dopant region formed within the substrate and the well region has the first conductive type. A second dopant region formed within the substrate and a portion of the well region has the second conductive type. A third dopant region formed under the second dopant region has the first conductive type, in which the second and the third regions form a vertical Zener diode. A fourth dopant region formed within the substrate and separated from the second dopant region by a separation structure has the second conductive type. A fifth dopant region is formed within the substrate in a manner that the fourth dopant region is between the isolation structure and the fifth dopant region, and has the first conductive type.

20 Claims, 7 Drawing Sheets

U.S. PATENT DOCUMENTS

| | | | |
|---|---|---|---|
| 6,130,117 A * | 10/2000 | Walker et al. | 438/133 |
| 6,177,298 B1 * | 1/2001 | Quigley | 438/135 |
| 6,576,934 B2 * | 6/2003 | Cheng et al. | 257/107 |
| 6,605,859 B1 * | 8/2003 | Romas et al. | 257/606 |
| 6,696,708 B2 * | 2/2004 | Hou et al. | 257/173 |
| 6,831,334 B2 * | 12/2004 | Okawa et al. | 257/356 |
| 6,946,690 B1 * | 9/2005 | Vashchenko et al. | 257/133 |
| 7,061,060 B2 * | 6/2006 | Yasuhara et al. | 257/409 |
| 7,173,308 B2 * | 2/2007 | Kitaguchi | 257/342 |
| 7,217,980 B2 | 5/2007 | Chen et al. | |
| 7,456,441 B2 * | 11/2008 | Tyler et al. | 257/173 |
| 2006/0220166 A1 * | 10/2006 | Kikuchi et al. | 257/481 |
| 2006/0226488 A1 | 10/2006 | Schneider et al. | |
| 2007/0096261 A1 * | 5/2007 | Otake et al. | 257/603 |

* cited by examiner

STRUCTURE OF SILICON CONTROLLED RECTIFIER

BACKGROUND OF THE INVENTION

1. Field of the Invention

This invention relates to a semiconductor device. More particularly, the invention relates to an electrostatic discharge (ESD) protection device.

2. Description of Related Art

Progress in semiconductor technology has decreased the dimensions of many semiconductor devices. As very large scale integration (VLSI) circuit geometry continues to shrink, the corresponding gate oxide thickness has also continued to decrease. This decrease in thickness, relative to breakdown voltage, has resulted in an increased susceptibility to damage from the application of excessive voltages. For example, an electrostatic discharge (ESD) event is capable of developing such an excess voltage. During an ESD event, charge is transferred between one or more pins of the device and another conducting object in a time period that is typically less than one microsecond. This charge transfer can develop voltages that are large enough to break down insulating films (e.g., gate oxides) on the device, or can dissipate sufficient energy to cause electrothermal failures in the device. Such failures include contact spiking, silicon melting, or metal interconnect melting.

Accordingly, ESD protection and its impact on the reliability of IC products in submicron CMOS technologies has become a primary concern. The resulting protection circuits may typically be connected to all Input/Output (I/O) pads of an integrated circuit (IC) to safely dissipate the energy associated with ESD events without causing any damage to the circuitry internal to the device. Protection circuits have also been connected to power supply pads, or between power supply buses to prevent such damage to internal circuits.

An ESD protection circuit that includes a silicon controlled rectifier (SCR) is considered to have very good electrostatic discharge performance. Since the SCR ESD protection circuit has a low snap-back holding voltage of about 1 to 5 volts and a low effective resistance of about 1 to 3 Ohms, it provides a very good discharge condition for the electrostatic current.

However, the breakdown voltage of the SCR ESD protection circuit is still too large. Therefore, it is possible that the SCR ESD protection circuit is not triggered when an ESD even occurs. This will damage the internal circuit. In addition, the current process is a kind of ultra shallow junction, and the junction area is too small to provide an effective trigger current. Furthermore, a larger layout area is required.

Therefore, there are needs to develop a new SCR structure that the breakdown voltage can be reduced and adjusted on demands. Furthermore, the SCR structure can also provide a smaller layout area.

SUMMARY OF THE INVENTION

According to the foregoing description, the invention is to provide a silicon controlled rectified capable adjusting its breakdown voltage, and further reducing the layout area.

According to the above objects, the present invention provides a silicon controlled rectifier structure in a substrate having a first conductive type. A well region is formed within the substrate, and has a second conductive type. A first dopant region is formed within the substrate and the well region, and has the first conductive type. A second dopant region is formed within the substrate and a portion of the well region, and has the second conductive type. A third dopant region is formed under the second dopant region, and has the first conductive type, in which the second and the third regions form a vertical Zener diode. A fourth dopant region is formed within the substrate and separated from the second dopant region, and has the second conductive type. A fifth dopant region is formed within the substrate in a manner that the fourth dopant region is between the second dopant region and the fifth dopant region, and has the first conductive type.

In addition, the present invention further provides a silicon controlled rectifier structure in a substrate having a first conductive type. A well region is formed within the substrate, and has a second conductive type. A first dopant region is formed within the substrate and the well region, and has the first conductive type. A second dopant region is formed within the substrate and a portion of the well region, and has the first conductive type. A third dopant region is formed under the second dopant region and has the second conductive type, in which the second and the third regions form a vertical Zener diode. A fourth dopant region is formed within the substrate and separated from the second dopant region, and has the second conductive type. A fifth dopant region is formed within the substrate in a manner that the fourth dopant region is between the second dopant region and the fifth dopant region, and has the first conductive type.

In one embodiment, the width of the third dopant region can be equal or less than a width of the second dopant region. The first conductive type can be P type, and the second conductive type can be N type, or vice versa.

In one embodiment, the silicon controlled rectifier further comprises a sixth dopant region, which is formed within the substrate and the well regions and has the second conductive type. The sixth dopant region serves as a resistor.

In one embodiment, the silicon controlled rectifier can further comprise a seventh dopant region, which is formed between the second dopant region and the isolation structure, and has the first conductive type. The third dopant region is located under the second and the seventh dopant regions.

In one embodiment, the silicon controlled rectifier can further comprise a plurality of isolation structures, arranged in a manner that the first, the second, the fourth and the fifth are respectively formed between two neighbor isolation structures. In addition, the separation structure can be a shallow trench isolation structure.

In one embodiment, when there is not the sixth dopant region, the silicon controlled rectifier further comprises a first and a second contact. The first contact is used for electrically connecting the fourth and the fifth dopant regions to serve as a cathode of the silicon controlled rectified. The second contact is used for electrically connecting the first dopant region to serve as an anode of the silicon controlled rectified.

In one embodiment, when there is not the sixth dopant region, the silicon controlled rectifier further comprises a first and a second contact. The first contact is used for electrically connecting the fourth and the fifth dopant regions to serve as a cathode of the silicon controlled rectified. The second contact is used for electrically connecting the first and the sixth dopant regions to serve as an anode of the silicon controlled rectified.

According to the invention, due to such vertical junction structure, the junction can be adjusted and increased, so that the breakdown area and breakdown voltage can be adjusted on demands. For an ultra shallow junction process, the invention can provide a better solution for ESD protection circuit for protecting the internal circuit. In addition, due to the vertical Zener diode structure, the layout area of the SCR can be further reduced.

While the specification concludes with claims particularly pointing out and distinctly claiming the subject matter which is regarded as the invention, the objects and features of the invention and further objects, features and advantages thereof will be better understood from the following description taken in connection with the accompanying drawings.

DESCRIPTION OF THE PREFERRED EMBODIMENT

The invention provides an SCR structure having a vertical Zener diode therein. Here, the term "vertical" means that the P and N dopant regions for the Zener diode are arranged vertically, rather than laterally. In the SCR structure, a first or a second conductive type dopant regions, well regions and substrate are provided. In the following embodiments, a P-type dopant and an N-type dopant are respectively used as examples for the first and the second conductive type.

Figure 1A:
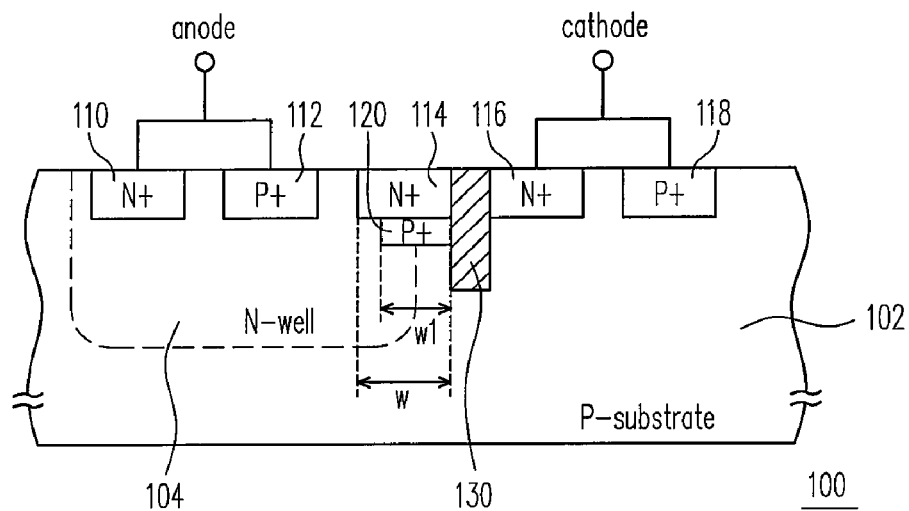
FIG. 1A schematically shows another embodiment of a Zener diode triggered SCR of the invention.

FIG. 1A schematically shows another embodiment of a Zener diode triggered SCR of the invention. As shown in FIG. 1A, the Zener diode triggered SCR 100 of the invention is provided in a semiconductor substrate (hereinafter, substrate) 102, and has a first conductive type. In this example, the first conductive type is P type. The substrate 102 is substantially divided in to two regions. For some applications, the two regions can be further separated by an isolation structure 130 as shown. The isolation structure 130, for example, is a shallow trench isolation structure. The isolation structure 130 is only an optionally element, and the Zener diode triggered SCR can function normally without the isolation structure 130. The following description is explanation with the isolation structure 130.

A well region 104 is formed within the substrate, and is provided with a second conductive type, i.e., N type in this example. In addition, a dopant region (first) 112 is formed within the substrate 102 and the well region 104. The dopant region 112 is provided with P type heavy dopant, i.e., a P+ dopant region 112. Further, a dopant region (sixth) 110 can be also formed in the well region 104. The dopant region 110 is provided with N type heavy dopant, i.e., an N+ dopant region 110. Basically, the N+ dopant region 110 serves as a resistor.

Furthermore, a dopant region (second) 114 is further formed within the substrate 102 and a portion of the well region 104. The dopant region 114 is provided with N type heavy dopant, i.e., an N+ dopant region 114. A dopant region (third) 120 is formed under the N+ dopant region 114, provided with P type heavy dopant, i.e., a P+ dopant region 120. The dosage of P+ dopant region 114 is equal to or larger than $10^{12}$, and a practical experience dosage can be $10^{12}$ to $10^{14}$. The P+ dopant region 120 and the N+ dopant region 114 form a vertical Zener diode. The width w1 of the P+ dopant region 120 can be equal to or less than the width w of the N+ dopant region 114. Namely, the junction width of the Zener diode is the width w1.

Due to the vertical Zener diode structure, the junction width w1 between the N+ dopant region 114 and the P+ dopant region 120 can be varied. In this manner, the breakdown voltage of the silicon controlled rectifier can be adjusted. Moreover, the layout area of the SCR can be further reduced since the P+ dopant region 120 is formed underneath the N+ dopant region 114.

In addition, a dopant region (fourth) 116 is formed within the substrate 102 and separated from the N+ dopant region 114 by the separation structure 130. The dopant region 116 is provided with N type heavy dopant, i.e., an N+ dopant region 116. A dopant region (fifth) 118 is formed within the substrate 102 and separated from the N+ dopant region 116. The N+ dopant region 118 is provided with N type heavy dopant, i.e., an N+ dopant region 118. The N+ dopant region 118 basically is a parasitic resistor of the SCR 100.

Referring to FIG. 1A, the SCR 100 can further comprises a first and a second contacts (not shown). The first contact is electrically connected to the N+ dopant region 110 and the P+ dopant region 112 to serve as an anode of the Zener diode triggered SCR 100. The second contact is electrically connected to the N+ dopant region 116 and the P+ dopant region 118 to serve as a cathode of the Zener diode triggered SCR 100.

Figure 1B:
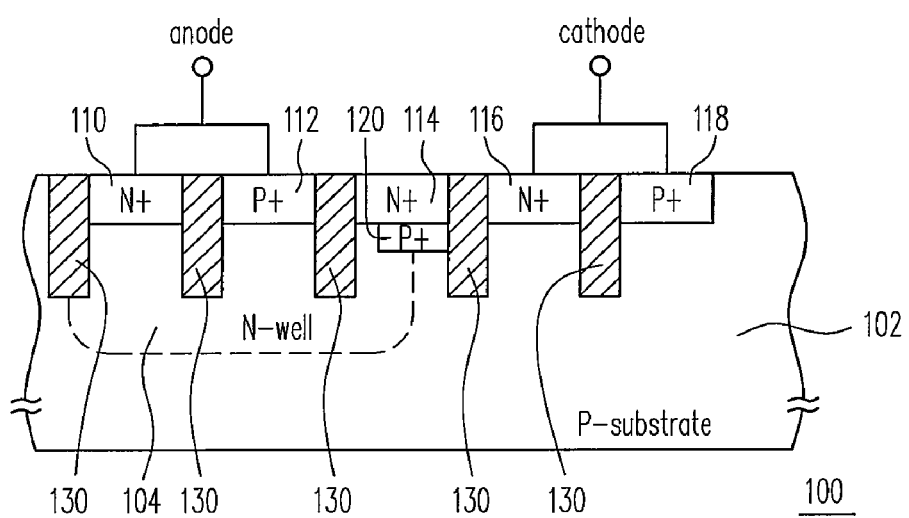
FIG. 1B schematically shows a variation structure for the Zener diode triggered SCR in FIG. 1A.
Figure 1C:
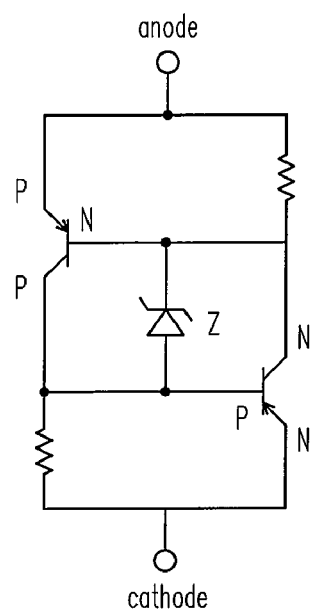
FIG. 1C schematically shows a portion of the vertical Zener diode junction of the embodiment of the present invention.
Figure 1D:
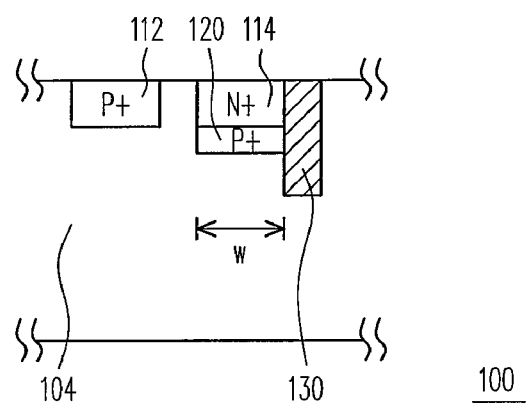
FIG. 1D is an equivalent circuit diagram of the SCR structure in FIG. 1A.

FIG. 1D is an equivalent circuit diagram of the SCR structure in FIG. 1A. As shown in FIG. 1A, the Zener diode triggered SCR 100 is constructed by the N+ dopant regions 110, 114, 116, the P+ dopant region 112, 120, 118, and the N well 104. Referring to FIG. 1A and FIG. 1D, the P+ dopant region 112, the N well 104 and the P+ dopant region 120 forms an equivalent PNP bipolar transistor. The Zener diode Z in FIG. 1D is formed with the P+ dopant region 120 and the N+ dopant region 114. The NPN bipolar transistor is formed with the N+ dopant region 114, the P+ dopant region 120 and then + dopant region 116. The N+ dopant region 110 and the P+ dopant region 118 serve as resistors, respectively. In FIG. 1D, the anode, formed with the N+ dopant region 110 and the P+ dopant region 112, can be connected to an internal circuit of a semiconductor device. The cathode, formed with the N+ dopant region 116 and the P+ dopant region 118, can be connected to a negative power line Vss, a positive power line Vdd, or ground (not shown).

FIG. 1B schematically shows a variation structure for the Zener diode triggered SCR in FIG. 1A. Isolation structures 130 are further formed between two neighbor dopant regions. As shown in FIG. 1B, the isolation structures 130 can be additionally formed between the N+ dopant region 110 and the P+ dopant region 112, between the P+ dopant region 112 and the N+ dopant region 114, between the N+ dopant region 114 and the N+ dopant region 116, or between the N+ dopant region 116 and the P+ dopant region 118. Similarly, the isolation structures 130 can be a shallow trench isolation structure.

The structure difference between FIG. 1A and FIG. 1B is the isolations 130. For a general semiconductor process, an isolation structure is usually formed between a P dopant region and an N dopant region. However, such isolation structures 130 can be omitted as shown in FIG. 1A if the electrical property of the SCR will not be affected. By omitting the isolation structures 130, the overall layout area can be further reduced.

FIG. 1C schematically shows a portion of the vertical Zener diode junction of the embodiment of the present invention. As described above, the width w1 of the P+ dopant region 122 can be equal to or less than the width w of the N+ dopant region 122 according to the embodiment shown in FIG. 1A. Since the isolation structure 130 is not formed between the P+ dopant region 112 and the N+ dopant region, there is enough space provided in the N well for breakdown area. However, when the isolation structure 130 is formed, the width of the P+ dopant region 120 should be less than the width w of the N+ dopant region 112.

Figure 2:
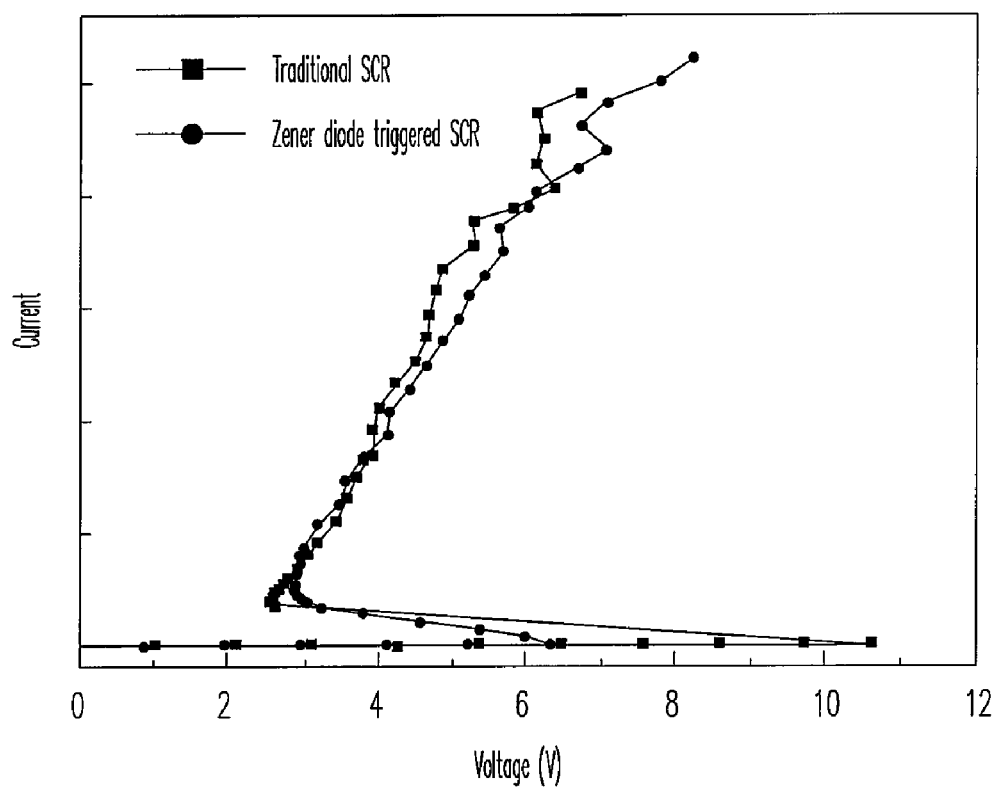
FIG. 2 is a voltage-current curve for comparison between a traditional SCR and a Zener diode triggered SCR of the invention.

FIG. 2 is a voltage-current curve for comparison between a traditional SCR and a Zener diode triggered SCR of the invention. As shown in FIG. 2, the I-V characteristic curve of the invented Zener diode triggered SCR (dotted curve) is proved that the breakdown voltage is significantly decreased in comparison with the traditional SCR. As a result, the Zener diode triggered SCR of the invention can provide a lower trigger voltage, and the SCR can be quickly and precisely turned on when an ESD event occurred.

Figure 3A:
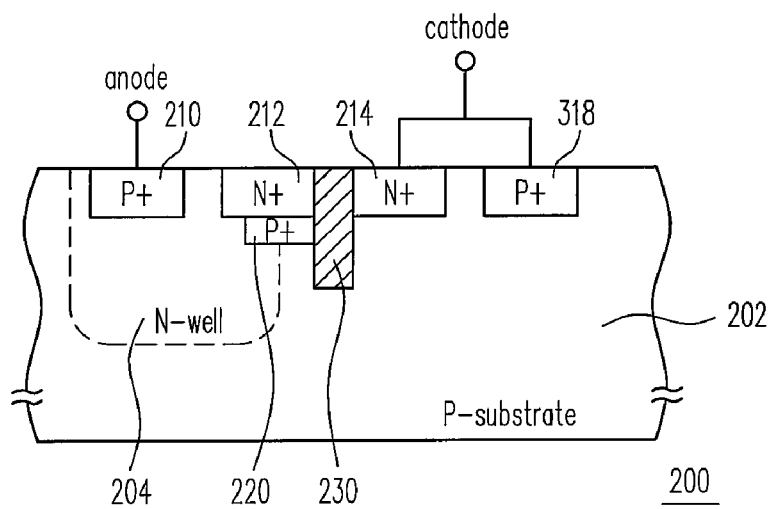
FIG. 3A schematically shows another embodiment of a Zener diode triggered SCR of the invention.

FIG. 3A schematically shows another embodiment of a Zener diode triggered SCR of the invention. The embodiment shown in FIG. 3A is a variation of the SCR structure shown in FIG. 1A. Basically, the structure of the SCR 200 is almost the same as the SCR 100 shown in FIG. 1A. In FIG. 3A, the resistor is omitted. As shown in FIG. 3A, the SCR 200 comprises a P substrate 202, an N well 204, a P+ dopant region 210, an N+ dopant region 212, a P+ dopant region 220, an N+ dopant region 214 and a P+ dopant region 216.

Similar to SCR 100 in FIG. 1A, the P+ dopant region 220 and the N+ dopant region 212 forms a vertical Zener diode. The width of the P+ dopant region 220 can be equal to or less than the width of the N+ dopant region 212.

Referring to FIG. 3A, the SCR 200 can also further comprises a first and a second contacts (not shown). The first contact is electrically connected to the P+ dopant region 212 to serve as an anode of the Zener diode triggered SCR 200. The second contact is electrically connected to the N+ dopant region 214 and the P+ dopant region 216 to serve as a cathode of the Zener diode triggered SCR 200.

Similar to the aforementioned SCR structure, although an isolation structure 230 is located between the N+ dopant region 214 and the N+ dopant region 212, the isolation structure 230 is also an optional element, and can be omitted for general applications.

Figure 3B:
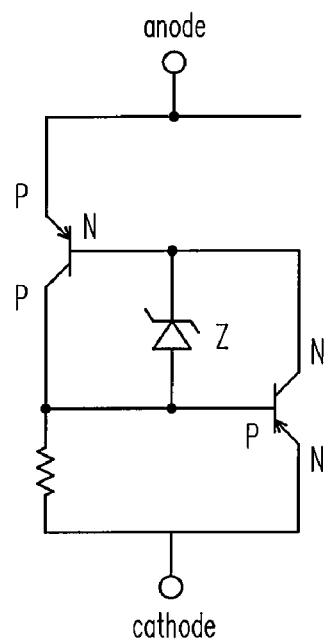
FIG. 3B is an equivalent circuit diagram of the SCR structure in FIG. 3A.

FIG. 3B is an equivalent circuit diagram of the SCR structure in FIG. 3A. As shown, the equivalent circuit is similar to the circuit shown in FIG. 1D. In FIG. 3B, the resistor connected between the anode and the collector of the NPN transistor is omitted. For certain case, the SCR circuit shown in FIG. 1A or 1D might have a parasitic diode between the anode and the cathode, i.e., the P+ dopant region 118, the P substrate 102, the P+ and the N well 104. A forward diode path is created by the parasitic diode. In some application, the forward diode path is forbidden, and therefore, the N+ dopant region 110 should be removed. Furthermore, due to the omission of the resistor, the layout area can be further reduced.

Figure 3C:
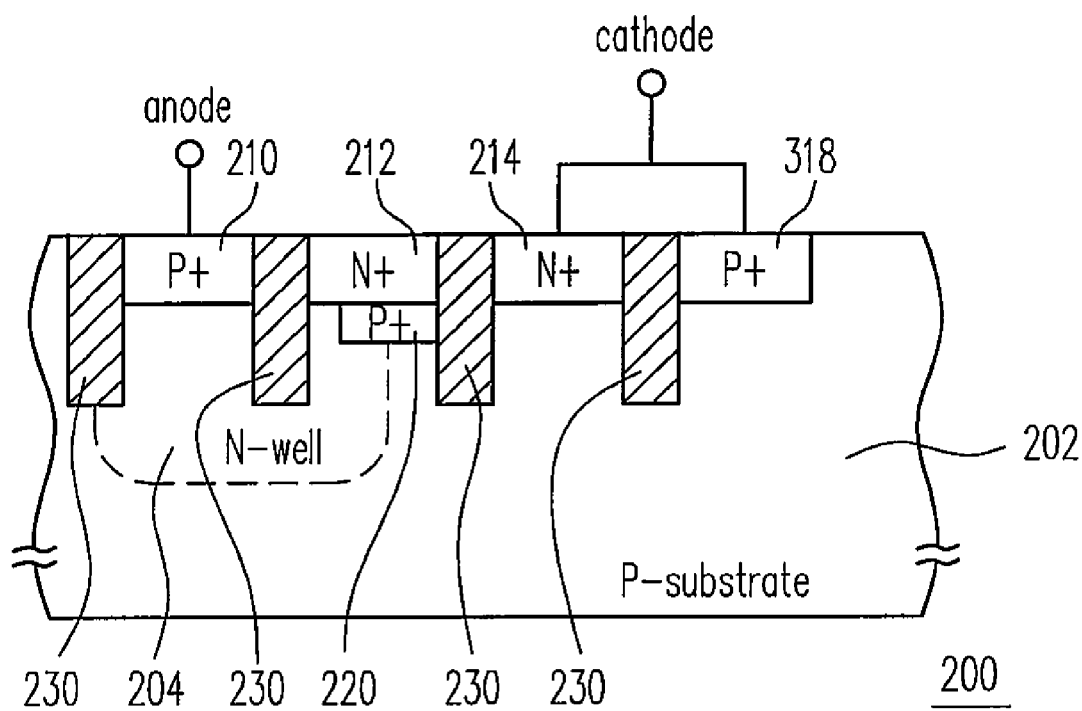
FIG. 3C schematically shows a variation structure for the Zener diode triggered SCR in FIG. 3A.

FIG. 3C schematically shows a variation structure for the Zener diode triggered SCR in FIG. 3A. This structure is similar to the structure shown in FIG. 1B, isolation structures 230 are further formed between two neighbor dopant regions. As shown in FIG. 3C, the isolation structures 230 can be additionally formed between the N+ dopant region 212 and the P+ dopant region 210, between the N+ dopant region 212 and the N+ dopant region 214, or between the N+ dopant region 214 and the P+ dopant region 216. Similarly, the isolation structures 230 can be a shallow trench isolation structure.

Figure 4:
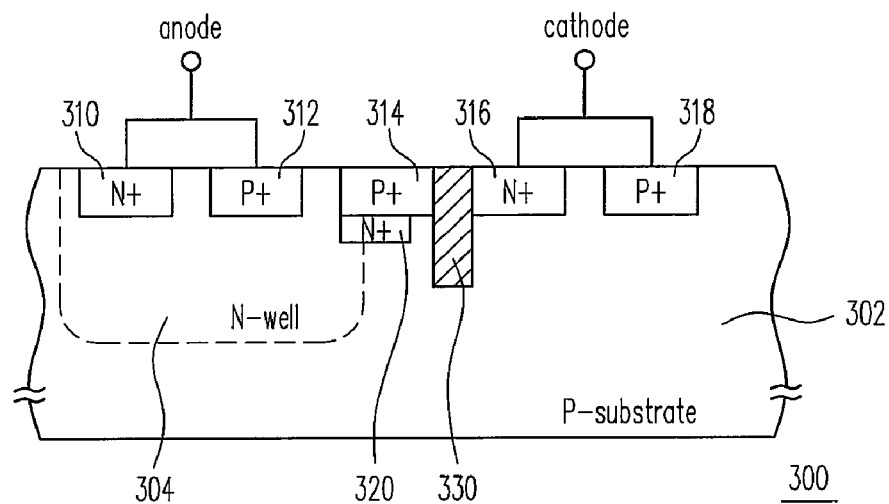
FIG. 4 schematically shows another embodiment of a Zener diode triggered SCR of the invention.

FIG. 4 schematically shows another embodiment of a Zener diode triggered SCR of the invention. As shown in FIG. 4, the SCR structure 300 is a variation of the SCR structure 100, and the basic structure is the same. The SCR 300 comprises a P substrate 202, an N well 204, an N+ dopant region 310, a P+ dopant region 312, a P+ dopant region 314, an N+ dopant region 320, an N+ dopant region 316 and a P+ dopant region 318. In FIG. 4, the P and N dopant regions of the vertical Zener diode is reversed in comparison with FIG. 1A.

Referring to FIG. 4, the SCR 300 can also further comprise a first and a second contacts (not shown). The first contact is electrically connected to the N+ dopant region 310 and the P+ dopant region 312 to serve as an anode of the SCR 300, while the second contact is electrically connected to the N+ dopant region 316 and the P+ dopant region 318 to serve as a cathode of the SCR 300.

Also, the width of the N+ dopant region 320 can be equal to or less than the P+ dopant region 314. FIG. 4 shows a case that the width of the N+ dopant region 320 is less than the P+ dopant region 314. In addition, similar to the structure shown in FIG. 3A or 3B, the resistor of the SCR 300 can be also omitted. Namely, the N+ dopant region 310 is optional.

Similar to the aforementioned SCR structure, although an isolation structure 330 is located between the P+ dopant region 314 and the N+ dopant region 316, the isolation structure 330 is also an optional element, and can be omitted for general applications.

Figure 5:
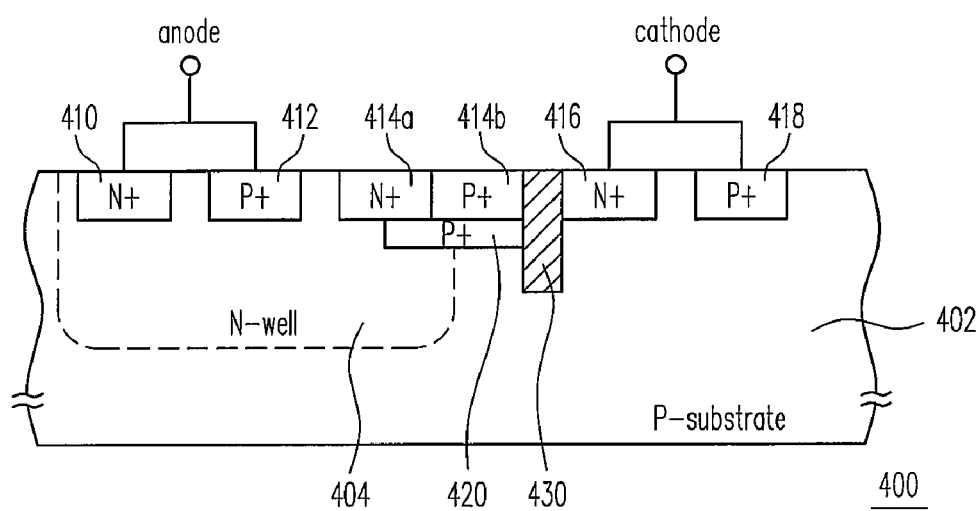
FIG. 5 schematically shows another embodiment of a Zener diode triggered SCR of the invention.

FIG. 5 schematically shows another embodiment of a Zener diode triggered SCR of the invention. The SCR 400 is a variation structure for the SCR 100. The SCR 400 comprises a P substrate 402, an N well 404, an N+ dopant region 410, a P+ dopant region 412, an N+ dopant region 414a, a P+ dopant region 414b, a P+ dopant region 420, an N+ dopant region 416 and a P+ dopant region 418.

The structure different between the SCR 100 and the SCR 400 is that a P+ dopant region 414b is further formed. Then, the P+ dopant region 420 is formed under N+ dopant region 414a and the P+ dopant region 414b. Also, the width of the P+ dopant region 420 can be equal to or less than a sum of widths of the N+ dopant region 414a and the P+ dopant region 414b. The N+ dopant region 414a, the P+ dopant region 414b and the P+ dopant region 420 forms the vertical Zener diode.

According to such SCR structure 400, the breakdown area can be further increased due to the existence of the P+ dopant region 414b. Therefore, the breakdown voltage of the SCR 400 can be further reduced and adjusted.

Similar to the aforementioned SCR structure, although an isolation structure 430 is located between the P+ dopant region 414b and the N+ dopant region 416, the isolation structure 430 is also an optional element, and can be omitted for general applications.

Figure 6:
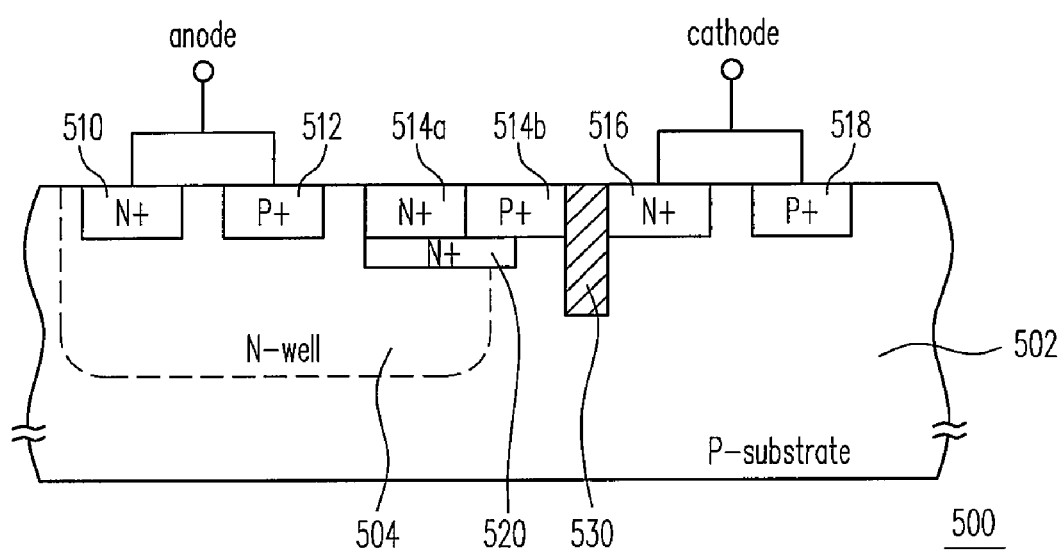
FIG. 6 schematically shows another embodiment of a Zener diode triggered SCR of the invention.

FIG. 6 schematically shows another embodiment of a Zener diode triggered SCR of the invention. The SCR 500 is a variation structure for the SCR 300. The SCR 500 comprises a P substrate 502, an N well 404, an N+ dopant region 510, a P+ dopant region 512, an N+ dopant region 514a, a P+ dopant region 514b, a N+ dopant region 520, an N+ dopant region 516 and a P+ dopant region 518.

The structure different between the SCR 300 and the SCR 500 is that an N+ dopant region 514a is further formed. Then, the N+ dopant region 520 is formed under N+ dopant region 514a and the P+ dopant region 514b. Also, the width of the N+ dopant region 420 can be equal to or less than a sum of widths of the N+ dopant region 514a and the P+ dopant region 514b. The N+ dopant region 514a, the P+ dopant region 514b and the N+ dopant region 520 forms the vertical Zener diode.

According to such SCR structure 500, the breakdown area can be further increased due to the existence of the N+ dopant region 414a. Therefore, the breakdown voltage of the SCR 500 can be further reduced and adjusted.

Similarly, the isolation structure 530 is also an optional element. In general applications, the SCR structure 500 can function well without such isolation structure. For each of the aforementioned embodiments, the isolation structures are not necessary elements. The dopant regions in the SCR structure can be formed without being separated by any isolation structure, or only a portion of dopant regions is separated by an isolation structure based on demands.

In summary, the embodiment of the invention uses a Zener diode of vertical junction type. Due to such structure, the junction can be adjusted and increased, so that the breakdown area and breakdown voltage can be adjusted on demands. For an ultra shallow junction process, the invention can provide a better solution for ESD protection circuit for protecting the internal circuit.

In addition, due to the Zener diode triggered SCR of the invention, the breakdown voltage can be significantly reduced. Therefore, internal circuit, which might be damaged by ESD due to high triggered breakdown voltage for a traditional SCR, can be protected by the lower breakdown voltage of the Zener diode triggered SCR of the invention. In addition, due to the vertical Zener diode structure, the layout area of the SCR can be further reduced.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A structure of a silicon controlled rectifier, comprising:
   a substrate, having a first conductive type;
   a well region, formed within the substrate, having a second conductive type;
   a first dopant region, formed within the substrate and the well region, and having the first conductive type;
   a second dopant region, formed within the substrate and a portion of the well region, and having the second conductive type;
   a third dopant region, formed under the second dopant region and having the first conductive type, wherein the second and the third regions forms a vertical Zener diode;
   a fourth dopant region, formed within the substrate and separated from the second dopant region, having the second conductive type; and
   a fifth dopant region, formed within the substrate in a manner that the fourth dopant region is between the second dopant region and the fifth dopant region, and having the first conductive type, wherein the second dopant region is between the first dopant region and the fourth dopant region.

2. The structure of claim 1, wherein a width of the third dopant region is equal or less than a width of the second dopant region.

3. The structure of claim 1, further comprising a sixth dopant region, formed within the substrate and the well regions, and having the second conductive type.

4. The structure of claim 1, further comprising a seventh dopant region, formed between the second dopant region and an isolation structure, having the first conductive type, wherein the third dopant region is located under the second and the seventh dopant regions.

5. The structure of claim 1, further comprising a plurality of isolation structures, arranged in a manner that the first, the second, the fourth and the fifth are respectively formed between two neighbor isolation structures.

6. The structure of claim 3, further comprising a plurality of isolation structures, arranged in a manner that the sixth, the first, the second, the fourth and the fifth are respectively formed between two neighbor isolation structures.

7. The structure of claim 1, further comprising:
   a first contact for electrically connecting the fourth and the fifth dopant regions to serve as a cathode of the silicon controlled rectified; and
   a second contact for electrically connecting the first dopant region to serve as an anode of the silicon controlled rectified.

8. The structure of claim 3, further comprising:
   a first contact for electrically connecting the fourth and the fifth dopant regions to serve as a cathode of the silicon controlled rectified; and
   a second contact for electrically connecting the first and the sixth dopant regions to serve as an anode of the silicon controlled rectified.

9. The structure of claim 1, wherein the isolation structure is a shallow trench isolation structure.

10. The structure of claim 1, wherein the first conductive type is P type, and the second conductive type is N type.

11. A structure of a silicon controlled rectifier, comprising:
    a substrate, having a first conductive type;
    a well region, formed within the substrate, having a second conductive type;
    a first dopant region, formed within the substrate and the well region, and having the first conductive type;
    a second dopant region, formed within the substrate and a portion of the well region, and having the first conductive type;
    a third dopant region, formed under the second dopant region and having the second conductive type, wherein the second and the third regions forms a vertical Zener diode;
    a fourth dopant region, formed within the substrate and separated from the second dopant region, having the second conductive type; and
    a fifth dopant region, formed within the substrate in a manner that the fourth dopant region is between the second dopant region and the fifth dopant region, and having the first conductive type, wherein the second dopant region is between the first dopant region and the fourth dopant region.

12. The structure of claim 11, wherein a width of the third dopant region is equal or less than a width of the second dopant region.

13. The structure of claim 11, further comprising a sixth dopant region, formed within the substrate and the well regions, and having the second conductive type.

14. The structure of claim 11, further comprising a seventh dopant region, formed between the second dopant region and an isolation structure, having the second conductive type, wherein the third dopant region is located under the second and the seventh dopant regions.

15. The structure of claim 11, further comprising a plurality of isolation structures, arranged in a manner that the first, the second, the fourth and the fifth are respectively formed between two neighbor isolation structures.

16. The structure of claim 13, further comprising a plurality of isolation structures, arranged in a manner that the sixth, the first, the second, the fourth and the fifth are respectively formed between two neighbor isolation structures.

17. The structure of claim 11, further comprising:
a first contact for electrically connecting the fourth and the fifth dopant regions to serve as a cathode of the silicon controlled rectified; and
a second contact for electrically connecting the first dopant region to serve as an anode of the silicon controlled rectified.

18. The structure of claim 13, further comprising:
a first contact for electrically connecting the fourth and the fifth dopant regions to serve as a cathode of the silicon controlled rectified; and
a second contact for electrically connecting the first and the sixth dopant regions to serve as an anode of the silicon controlled rectified.

19. The structure of claim 14, wherein the isolation structure is a shallow trench isolation structure.

20. The structure of claim 11, wherein the first conductive type is P type, and the second conductive type is N type.

* * * * *